United States Patent [19]
Levinson
[11] 4,364,021
[45] Dec. 14, 1982

[54] LOW VOLTAGE VARISTOR CONFIGURATION

[75] Inventor: Lionel M. Levinson, Schenectady, N.Y.
[73] Assignee: General Electric Company, Schenectady, N.Y.

[21] Appl. No.: 840,262
[22] Filed: Oct. 7, 1977
[51] Int. Cl.3 .............. H03K 17/30
[52] U.S. Cl. .............. 338/20; 338/22 R
[58] Field of Search .............. 338/20, 22 R

[56] References Cited

U.S. PATENT DOCUMENTS

| | | | |
|---|---|---|---|
| 2,959,504 | 11/1960 | Ross | 338/20 X |
| 2,989,713 | 6/1961 | Warner | 338/20 |
| 3,061,739 | 10/1962 | Stone | 338/20 X |
| 3,195,091 | 7/1965 | Kujawa | 338/20 |
| 3,401,318 | 9/1968 | Jensen | 338/22 R |
| 3,546,540 | 12/1970 | Bhola | 338/20 |
| 4,069,465 | 1/1978 | Kouchich | 338/20 |
| 4,103,274 | 7/1978 | Burgess | 338/20 X |

*Primary Examiner*—R. R. Kucia
*Attorney, Agent, or Firm*—Marvin Snyder; James C. Davis, Jr.

[57] ABSTRACT

Metal oxide varistor structures having a low breakdown voltage, low leakage current, high values of alpha, operational stability, and methods of making the same are disclosed. In accordance with one embodiment of the invention relating to metal oxide varistor structures, at least one of the planar surfaces of a varistor disk, for example, is provided with a recessed region for increasing the electric field intensity in the region of the recess and hence reducing the breakdown voltage of the varistor disk without altering the structural integrity of the disk. Methods for making varistor structures with one or more recesses on one or more surfaces of the varistor structures are also disclosed.

6 Claims, 9 Drawing Figures

LOW VOLTAGE VARISTOR CONFIGURATION

BACKGROUND OF THE INVENTION

This invention relates to polycrystalline metal oxide varistors. More particularly, this invention relates to a novel configuration of polycrystalline metal oxide varistors by which the breakdown voltage of the varistor is made to occur at a lower voltage. The term "breakdown" is not meant to denote device failure, but is used only to designate a value of voltage across the device beyond which the current through the device increases dramatically. That is to say, for voltage values below the breakdown voltage, the device behaves like an ohmic resistor of very large value (in the megohm range) but when the breakdown voltage is exceeded, the device behavior is very much like that of a low resistance conductor. These devices exhibit a very non-linear current voltage characteristic which is expressed by the equation $$I = \left(\frac{V}{C}\right)^{\alpha}$$

where

- I is the current flowing through the material,
- V is the voltage across the material,
- C is a constant which is a function of the physical dimensions of the body of the device, its composition, and the parameters of the process employed to form the body, and is a measure of the voltage at which breakdown occurs, and
- $\alpha$ is a constant for a given range of current and is a measure of the nonlinearity of the resistance characteristic of the body.

Metal oxide varistors are sintered ceramics composed principally of zinc oxide with a mixture of various other metal oxides added. These other oxides are typically bismuth trioxide, cobalt trioxide, manganese dioxide, antimony trioxide, and tin dioxide, each being present to the extent of approximately one-half to one mole percent, the remainder of the material being zinc oxide. This powder is ground and pressed into the desired shape after which the material is sintered at a temperature of approximately 1,000° C. to 1,400° C. After this, electrodes are applied to faces of the material. Wires are then attached to the electrode surfaces for connection to external circuits.

The materials and processes for making metal oxide varistors are well known in the art and are described, for example, in U.S. Pat. No. 3,962,144 issued to Matsuura et al.

The metal oxide varistor, in many respects, is similar to a bidirectional Zener diode, in that when a voltage is applied in excess of a certain value, the characteristic resistance of the device decreases dramatically and conduction through the device occurs. This non-linear conduction characteristic renders the metal oxide varistor an important element in a variety of protective circuit configurations. The better metal oxide varistors have a value of alpha in excess of 10. In general, the higher the value of alpha the sharper is the transition from the non-conductive to the conductive operating regions of the device.

One of the deficient characteristics of low voltage varistors manufactured in accordance with the prior art is that they have a high upturn value. That is to say, the value of the exponent alpha becomes lower at higher current values. This means that the voltage across the device becomes too high too quickly. It is thus said that a varistor should have low upturn.

Similarly, when the varistor is operating below its breakdown voltage, it should exhibit a high resistance characteristic. This means that for a given voltage the current through the device should be minimal. A typical voltage point that is chosen is one-half of the breakdown voltage and at this voltage the current through the device is measured and is referred to as the leakage current. Hence, it is desired that varistor devices have a low value for this leakage current.

The process of making varistors described above crystals of zinc oxide in the material. These crystals range in size from between 5 and 50 microns, the typical grain size being approximately 25 microns. The varistor effect that is produced occurs as a result of grain boundaries between the zinc oxide grains; and it is known that each grain boundary exhibits a breakdown voltage of approximately 3 volts. Hence, a one millimeter slab of the sintered ceramic metal oxide varistor powder possesses approximately 40 grain boundaries on the average, assuming a grain size of 25 microns. This results in a breakdown voltage of 120 volts. Hence, in order to get varistors where the cut-off voltage lies in the range below approximately 40 volts, it is necessary to produce ceramic slabs of varistor material well below one-half millimeter in thickness. Slabs of this thickness have extremely poor mechanical properties and fracture very easily.

It thus appears that in order to get low breakdown voltage varistors, one can have varistor material of extreme thinness. One of the solutions posed for this problem is described in Japanese open patent No. 51-52988 (1976), in the name of Satoru Ogihara et al. The Ogihara et al. patent appears to disclose a procedure in which bismuth and manganese oxide are mixed with zinc oxide in a powder form and heated at 1,000°-1,400° C. in an oxidizing atmosphere, after which the powder is mixed with an organic or inorganic binder and following this step the resultant mixture is pressed or otherwise shaped into the desired form. Ogihara et al. appears to disclose that this material may be pressed into thin sheets whereby the breakdown voltage may be lowered. However, these devices lack mechanical strength.

However, at present, it is difficult to get quality varistors where the breakdown voltage lies in the range below approximately 40 volts. These devices have high leakage current, a mediocre value of the exponent alpha, high upturn, and poor operational stability compared to varistors operating at higher breakdown voltages. One of the other methods for solution to this problem has attempted to increase the size of the zinc oxide grains and therefore to reduce the number of zinc oxide grain boundaries. Typically, this is done by the addition of grain growth accelerators such as titanium dioxide. However, this method of lowering the breakdown voltage has the disadvantage of causing current channeling through the varistor due to local exaggerated grain growth, thereby causing nonuniform current conduction across the surface of the device.

Another method for producing low breakdown voltage varistor devices is by decreasing the over-all thickness for a given grain size. This method results in a device with poor mechanical properties, namely, such devices are easily fractured in handling and therefore it becomes economically unattractive to manufacture devices of such small thickness by the usual automated methods. In the configuration in which polycrystalline metal oxide varistors are presently fabricated, the varistor material is pressed into a disk shaped body having a pair of opposed major faces and the disk is then sintered to produce a ceramic varistor disk. An electrode coating is applied to the opposing major face ot each disk, most commonly by applying a silver electrode paste which is then fired onto the ceramic disk. Other commonly used methods include metal evaporation, plasma spraying, or coating with an indium-gallium eutectic. Wires are then attached and the device is encapsulated in an appropriate package.

Lowering the breakdown voltage on these devices by increasing the zinc oxide grain size is not an attractive alternative. This method leads to current channeling through the disk in which very small cross-sectional areas of the disk carry almost all of the current flowing through the disk causing thermal hot spots within the disk which may cause it to fracture or otherwise contribute to premature failure of the disk.

SUMMARY OF THE INVENTION

In accordance with one embodiment of the present invention, a typical varistor shape such as a disk, cylinder, or slug is provided with recesses, dimples, or a honeycomb type structure, the troughs of which provide for a varistor of smaller effective thickness. A single such recess or a plurality of them may be provided, if desired. These recesses provide the desired electrical characteristics without substantially altering the mechanical integrity of the varistor.

In accordance with another embodiment of the invention, recess or recesses are filled entirely with a conductive electrode coating rather than having such a material conform to the contour of the recessed surface. These coating materials, in addition to being good electrical conductors, are also good thermal conductors and provide the varistor with superior heat dissipation properties.

Several preferred methods are described for producing the appropriate recesses in a varistor material. One method for example, is to use a solid core drill with an abrasive on the standard varistor material. Another useful method is to use a die to press the desired shape into a varistor powder during the shaping or pressing process of varistor manufacture. Another useful method to produce such recesses is by chemical etching.

In this specification and in the appended claims, a recess includes a non-perforating depression or region of reduced thickness in an otherwise substantially planar structure in which the bottom of the depression is of a substantially uniform distance below the planar surface.

Accordingly, it is an object of this invention to provide a low breakdown voltage metal oxide varistor structure having low leakage current, high exponent values (that is, preferably greater than 10), low upturn, good operational stability, and improved heat dissipation characteristics.

It is a further object of this invention to provide methods for the production of metal oxide varistor with one or more recesses or regions of diminished thickness for providing the foregoing characteristics.

DETAILED DESCRIPTION OF THE INVENTION

Figure 1A:
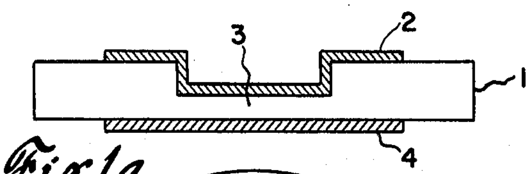
FIG. 1*a* is a cross-sectional view of a varistor constructed in accordance with the present invention.

It is well known in the varistor art that to produce metal oxide varistors having a low breakdown voltage it is necessary to do one of two things. First, the grain size of the crystalline substance of the varistor can be increased. Unfortunately, increased grain size causes undesirable electrical properties such as current channeling due to exaggerated local grain growth which can lead to subsequent degradation of the varistor characteristics. Second, the device thickness can be decreased. However, the material thicknesses required for producing low breakdown voltage varistors, that is, varistors having a breakdown voltage of approximately 40 volts or less are small, generally less than 0.5 millimeter so that the varistors become extremely fragile and hence it becomes very difficult for them to be processed by automated machinery.

As is indicated above, there is approximately a three volt value contributed to the breakdown voltage for every zinc oxide grain boundary that exists between the surfaces of the device. With a grain size of approximately 25 microns, it is seen that a one millimeter thickness slab of varistor material will exhibit a breakdown voltage of approximately 120 volts, that is, 3 volts across each of the 40 grain boundaries that exist. The relation between thickness and breakdown voltage is approximately linear. Hence, to arrive at a breakdown voltage of approximately 40 volts would require a device thickness of approximately 0.3 millimeters. Thus, a device with a breakdown voltage of approximately 40 volts would involve a thickness of approximately 13 zinc oxide grains. An even lower breakdown voltage of 20 volts would require a thickness of approximately 0.16 millimeters and hence a thickness in terms of grain boundaries of about 6 grains. Below this value of 6 grains, it becomes increasingly difficult to insure a uniform thickness as expressed in the number of grain boundaries.

To solve these and other problems, a novel varistor structure is described herein. This novel structure retains the structural integrity of a flat disk or plate, for example, while providing one or more recesses in at least one of the major faces of the material to provide a desired breakdown characteristics. FIG. 1 shows, by way of example, a preferred embodiment of the novel varistor configuration with a single recess provided. This recess is produced in the varistor body 1 by drilling, chemical etching, or by pressing the varistor powder into the desired shape before sintering. The methods for producing these recesses are more particularly described below. By way of illustration, the varistor powder mixture is typically composed mostly of zinc oxide with other metal oxides added such as the oxides of bismuth, cobalt, manganese, tin, and antimony. Such compositions are well known in the varistor art.

Figure 1B:
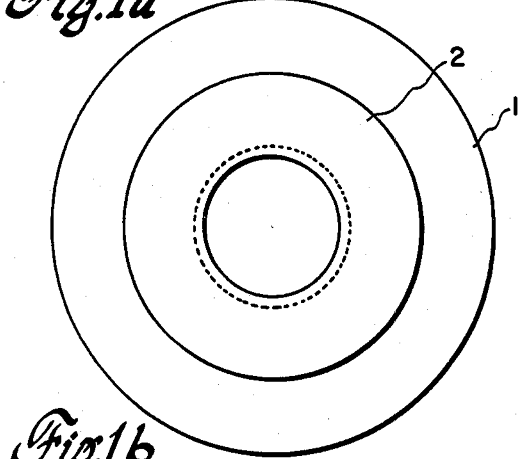
FIG. 1*b* is a plan view of the varistor of FIG. 1*a*.

In FIG. 1*a*, the recess shown provides an area 3 of reduced body thickness, so as to produce a varistor with low breakdown voltage, without sacrificing mechanical rigidity which is provided by the surrounding varistor material. The non-recessed or thicker areas of the device provide only for mechanical strength but do not interfere with the electrical operation, in particular the breakdown voltage. Since there is approximately a linear relation between the breakdown voltage and the device thickness, it is obvious that the breakdown voltage for the device is controlled by the regions of lesser thickness which are the first regions to switch into a conductive state when a voltage is applied. The areas of lesser thickness are first to exhibit the desired breakdown characteristic. Since these thinner areas are the first to exhibit the switching into the conducting region, all of the current flows through these thinner regions thus clamping the voltage at approximately the breakdown voltage of the device, rendering it impossible for the voltage across the device to increase to such a value as to cause current conduction through the regions of greater thickness.

After manufacture by any of the methods mentioned above, which will be discussed in detail below, suitable conducting electrode material 2 is applied to the recessed surface by either evaporation or deposition. Similar electrode conductive material 4 is applied to the opposite face of the varistor. The most common method used for such an electrode application is the application of a silver powder mixed with finely ground fused glass with a suitable cohesive vehicle. This composition is applied to the varistor and then fired resulting in the evaporation of the cohesive vehicle material and leaving a conductive silver coating. Another method of conductive electrode coating application is to apply a eutectic mixture of indium and gallium. If a metallic evaporation method is used to apply the conductive coating, aluminum, silver, or gold, for example, are usable. Still another process of conductive electrode application is plasma spraying with nickel, copper or aluminum. In any event, however, it is desirable that the electrode material not be deposited too close to the edge of the material, as is shown in FIGS. 1-4 and FIG. 8.

After the application of the conductive electrode material wires are attached to the device and it is suitably packaged.

Figure 2:
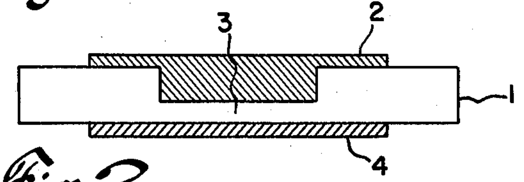
FIG. 2 is a side elevation view of a cross section through a varistor made in accordance with the present invention with a conductive coating filling the recess.

FIG. 2 also shows a similar varistor structure except that here the conductive electrode material applied to the upper face 2 is applied in such a manner so as to completely fill the recesses rather than just to conformably coat the surfaces of the recesses. In this particular configuration, the electrode coating acts as a heat sink for thermal energy dissipation in the device. Even though the basic ingredient in the varistor material, namely, the zinc oxide, is an efficient thermal conductor, the electrical conductive material applied to the varistor surfaces is in general a better thermal conductor and in addition the recesses provide for a greater surface area for the transfer of thermal energy from the varistor body 1 1 to the conductive coating 2.

Figure 3:
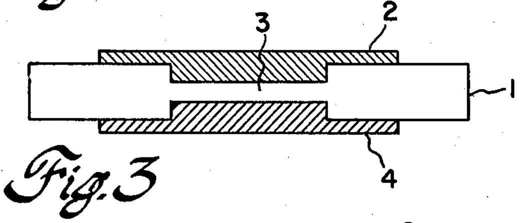
FIG. 3 is a side elevation view of a cross section through a varistor made in accordance with the present invention with a recess being present on both of the major faces of the varistor disk.

FIG. 3 shows a similar varistor structure to that shown in FIG. 1 except that here a recess is provided on both major faces of the varistor body 1. The configuration shown in FIG. 3, while being more difficult to manufacture, exhibits a better structural integrity when the varistor bodies are handled by automated equipment. In particular, in this configuration, the fragile, narrow recessed region need not come in contact with any of the automated mechanical handling apparatus. In addition, this configuration exhibits more uniform heat dissipation.

Figure 4:
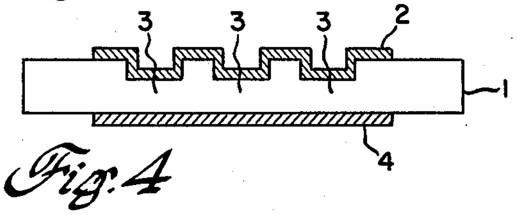
FIG. 4 is a side elevation view of a cross section through a varistor made in accordance with the present invention with a plurality of recesses being present on one of the major faces of the varistor disk.

FIG. 4 shows a similar varistor structure except that a plurality of recesses are provided. This configuration exhibits improved current distribution characteristics when compared to the configuration in which only a single recess is present. In this multiple recess configuration, the thicker areas of the device act as additional heat sinks for the conducting thinner regions with which the thicker regions are in intimate contact. FIG. 4 also shows conductive electrode material 2 applied to the upper recessed varistor surface and it also shows this conductive coating 4 applied to the other major varistor surface.

Figure 5:
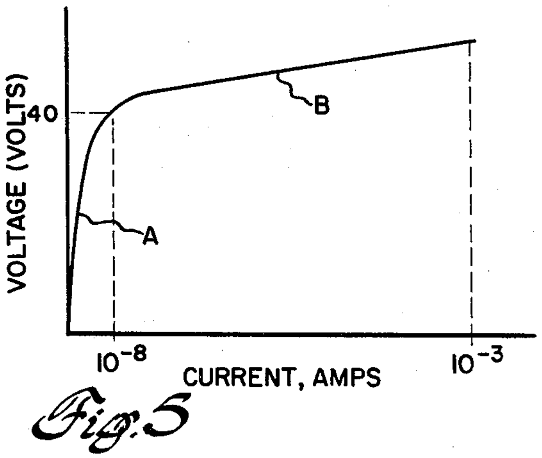
FIG. 5 is a graph of the voltage current characteristic for a typical varistor, plotted on a log-log scale, showing the two operating regions of a typical varistor device and the breakdown voltage.

FIG. 5 shows a typical current characteristic expressed on a log-log plot for a metal oxide varistor. Two regions of the curve are shown. The first region A is the region below varistor conduction where the resistance of the device is very high (about 10,000 MΩ). Region B of the curve exists beyond the breakdown voltage and in this region the device behaves like a conductor, although a non-ohmic one. The slope of the curve in region B is related to the alpha exponent value. In particular, the inverse of the slope of this curve is equal to $\alpha$. Hence, for a high alpha value, it is desirable that the slope of the curve in region B, be as small as possible. On the other hand, the slope of the curve in region A is desired to be as large as possible. Moreover, the typical varistor device has ohmic characteristics when being operated below the breakdown voltage, in region A.

By way of illustration of the characteristics of the devices produced in accordance with the invention disclosed herein, it is observed that in such devices where a thin region of 0.395 millimeters is provided in a 1 millimeter thick varistor the resulting value of alpha is approximately 22, the breakdown voltage is approximately 58 volts, and the value of alpha is uniform from approximately $10^{-8}$ to $10^{-3}$ amperes. Also, by way of illustration, when the dimension of the thin region is reduced to 0.3048 millimeters, a value of alpha approximately equal to 22 to obtained at a breakdown voltage of approximately 44 volts, and again the value of alpha is uniform from approximately $10^{-8}$ amperes to $10^{-3}$ amperes.

Figure 6:
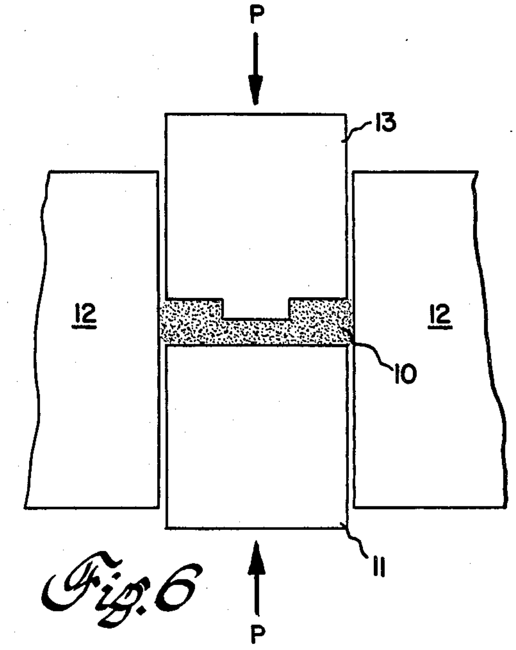
FIG. 6 is a side elevation view of the cross section of a die arrangement for pressing the varistor powder into a desired shape in accordance with one preferred embodiment for practicing the invention.

FIG. 6 shows a standard die press which is used for the compression of the varistor powder mix into the desired presintering shape, such as those shapes shown in FIG. 1*a*, FIG. 2, FIG. 3, FIG. 4 or FIG. 8. The die press comprises a lower die piece 11 and an upper die piece 13, both of which are movable in a fixed guide member 12 and both of which have pressure P applied to their external faces. Between die piece 11 and die piece 13, there is placed the desired metal oxide varistor powder 10 as described above, to be compacted before sintering. The end of movable die piece 13, opposite to that which pressure is applied, is in the negative of the shape of the desired varistor surface.

Figure 7:
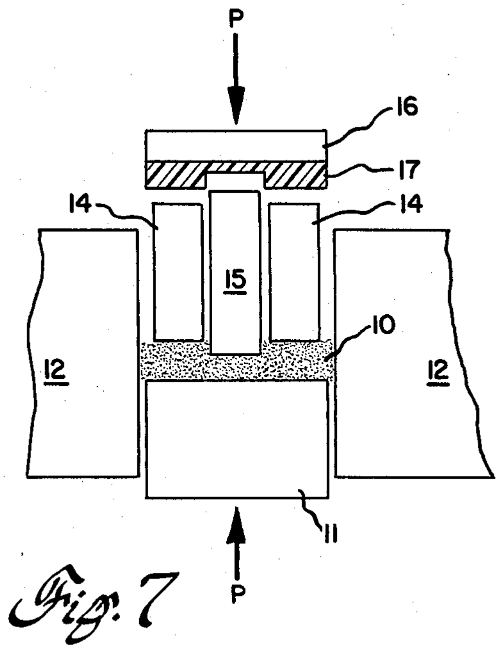
FIG. 7 is a side elevation view of a cross section of an improved die press arrangement in accordance with another preferred embodiment for practicing the present invention.

FIG. 7 shows an improved version of this die press which provides for a more uniform distribution of pressure throughout the varistor powder 10. In FIG. 7 the die piece member 13 of FIG. 6 is replaced by several other movable die piece members, namely, 14,15,16, and 17. These die piece members are cylindrical in shape as would be die piece members 11 and 13 of FIG. 6, but need not be and may in fact take other shapes, as desired or required, to meet specific physical design needs. A die piece member 14 is provided with a hole through which die piece member 15 is inserted. This central die piece member 15 can be varied in length so as to control the depth of the recesses in the varistor material and consequently the resultant breakdown voltage, as described above. The deeper the recess being, the lower the breakdown voltage. Above movable die piece members 14 and 15, there is placed a deformable member 17 in substantially the same shape as the upper portions of members 14 and 15. It is this member 17 which provides for a more equal distribution of the applied pressure throughout the metal oxide varistor powder 10. Above deformable member 17 there is placed a pressure plate 16 which is substantially in the same shape as the upper part of member 17 to which the pressure P is applied. It would be obvious to one skilled in the art to use other movable die piece arrangements to produce a plurality of recesses or to produce a varistor configuration with recesses on both sides of the varistors.

As is well known in the prior art, other methods for applying pressure could be utilized, in particular, isostatic pressure application. But in any event, the preferred range of pressure applied either in the isostatic process or the uniaxial process described in FIGS. 6 and 7 is approximately from 2,000 to 20,000 lbs/in$^2$.

Similarly, it is possible to provide recess in the varistor material by chemical etching. By far the largest ingredient in the varistor powder is the zinc oxide. This is still true after the powder has been sintered. Fortunately, zinc oxide is a very easy material to etch. It is soluable in mineral acid and some alkalis, and in particular it is soluable in sodium hydroxide, perchloric acid, hydrochloric acid, nitric acid, and ammonium chloride. To control the area of the sintered material which is etched an appropriate mask is used. The particular etchant that is used is dependent upon the composition of the masking material. A directed jet of etchant is also usable.

Another method of providing recesses in the varistor material is by mechanical drilling. The drilling done either after final sintering or after a partial sintering which does not render the wafer as hard to drill through as full sintering does. Since the drilling is to be done after the varistor is sintered or partly sintered, a carbide drill is used. Other suitable abrasives such as diamonds are also used. Other suitable abrasive materials may be used. However, in general, the use of drills and abrasives does leave the varistor surface scratched.

Figure 8:
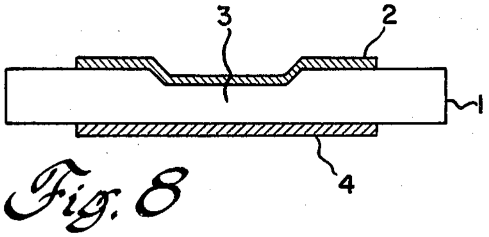
FIG. 8 is a side elevation view of a cross section through a varistor made in accordance with the present invention in which the walls of the recess are tapered.

FIG. 8 shows a metal oxide varistor configuration of the present invention in which the walls of the recess are tapered. This shape renders it particularly easy to remove the pressed powder from the die press members following the pressing operation. To assure the facility of this removal, binders or waves are added to the varistor powder prior to pressing.

The resultant varistor configuration permits the manufacture of devices with a low breakdown voltage and also with a smaller grain size. To produce such devices with a low breakdown voltage, prior art has had to rely upon devices with a large grain size which consistently yield devices having high leakage, mediocre exponent alpha, high upturn value, poor operational stability, or mechanical fragility.

Since the thicker regions of the device proposed here provide only for mechanical and non-electrical properties, they can be made to provide even greater mechanical strength than has existed heretofore in prior art varistors or shaped for purposes of packaging.

While this invention has been described with reference to particular embodiments and examples, other modifications and variations will occur to those skilled in the art in view of the above teachings. Accordingly, it should be understood that within the scope of the appended claims, the invention may be practiced otherwise than is specifically described.

The invention claimed is:

1. A polycrystalline metal oxide varistor comprising a sintered wafer, said wafer having two major opposing faces, with at least one recess in at least one of said major faces, each said recess having a substantially uniform depth, said recessed wafer having a single conductive coating of electrode material on each major face thereof, said coating electrically connecting the bottoms of each recess present on its corresponding face, whereby the breakdown voltage is lowered but mechanical strength remains substantially unaltered.

2. The varistor of claim 1 in which the conductive coating of electrode material fills any recess present, whereby heat conduction from said varistor is improved.

3. The varistor of claim 1 in which there are a plurality of recesses.

4. The varistor of claim 1 in which the recesses are arranged substantially in a honeycomb pattern.

5. The varistor of claim 1 in which there is a single recess in one of said major faces.

6. The varistor of claim 1 in which there is a single recess in each of said major faces, each recess being substantially opposed to the other positionally.

* * * * *